(12) United States Patent
Hosotani

(10) Patent No.: US 6,778,426 B2
(45) Date of Patent: Aug. 17, 2004

(54) MAGNETIC RANDOM ACCESS MEMORY INCLUDING MEMORY CELL UNIT AND REFERENCE CELL UNIT

(75) Inventor: Keiji Hosotani, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 16 days.

(21) Appl. No.: 10/212,734

(22) Filed: Aug. 7, 2002

(65) Prior Publication Data

US 2003/0031045 A1 Feb. 13, 2003

(30) Foreign Application Priority Data

Aug. 8, 2001 (JP) ............................... 2001-241132

(51) Int. Cl.[7] ............................................ G11C 11/00
(52) U.S. Cl. ..................... 365/158; 365/173; 365/171
(58) Field of Search ............................. 365/158, 171, 365/173, 210, 66, 55, 209

(56) References Cited

U.S. PATENT DOCUMENTS 6,055,178 A    4/2000 Naji ........................... 365/158
6,278,631 B1 * 8/2001 Naji ........................... 365/158
6,385,109 B1 * 5/2002 Naji ........................... 365/209

OTHER PUBLICATIONS

M. Durlam, et al., "A low power 1 Mbit MRAM based on 1T1MTJ bit cell integrated with Copper Interconnects", 2002 Symposium on VLSI Circuits Digest of Technical Papers, IEEE, 2002.

* cited by examiner

*Primary Examiner*—David Lam
(74) *Attorney, Agent, or Firm*—Oblon, Spivak, McClelland, Maier & Neustadt, P.C.

(57) ABSTRACT

A magnetic memory device includes a first resistance element formed in a memory cell unit, and at least one second resistance element and at least one third resistance element formed in a reference cell unit. The first, second, and third resistance elements store binary data by a resistance change. The second resistance element stores one of the binary data. The third resistance element stores the other of the binary data.

16 Claims, 11 Drawing Sheets

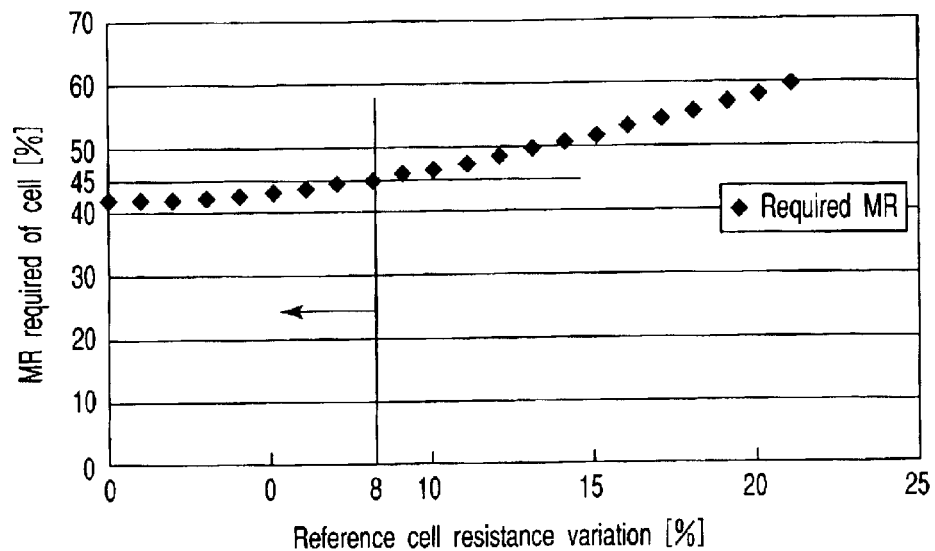
F I G. 5
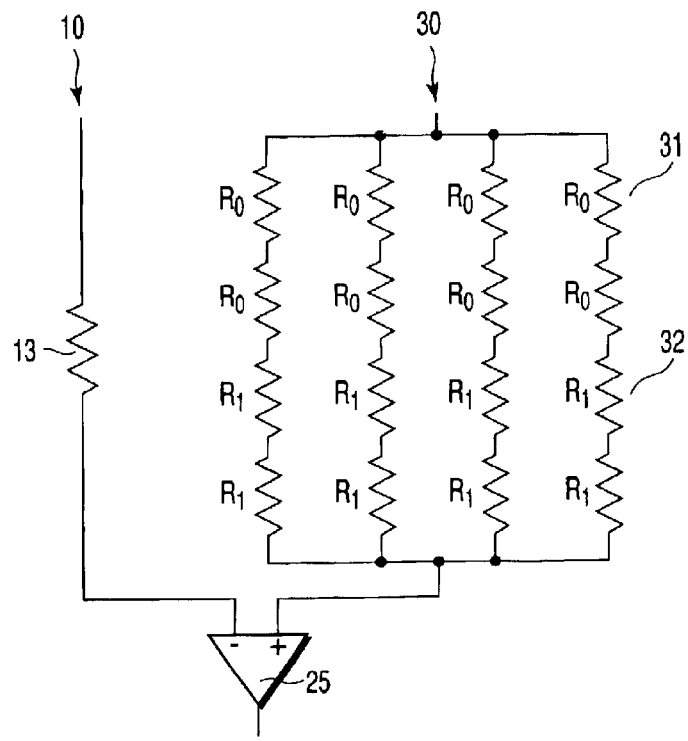
F I G. 6A

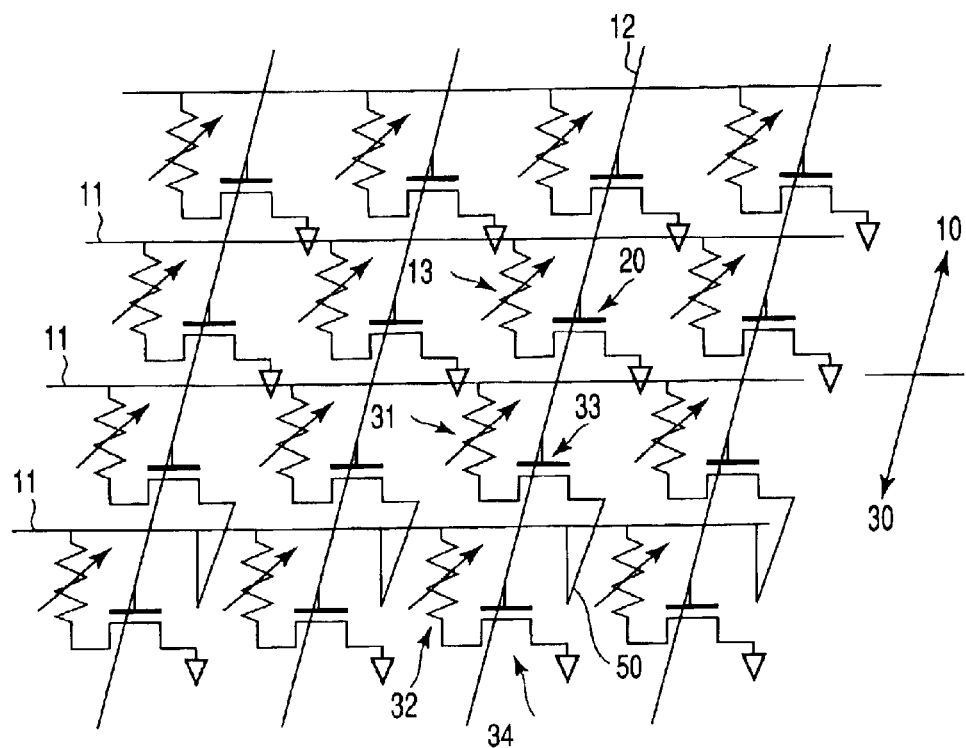
F I G. 12
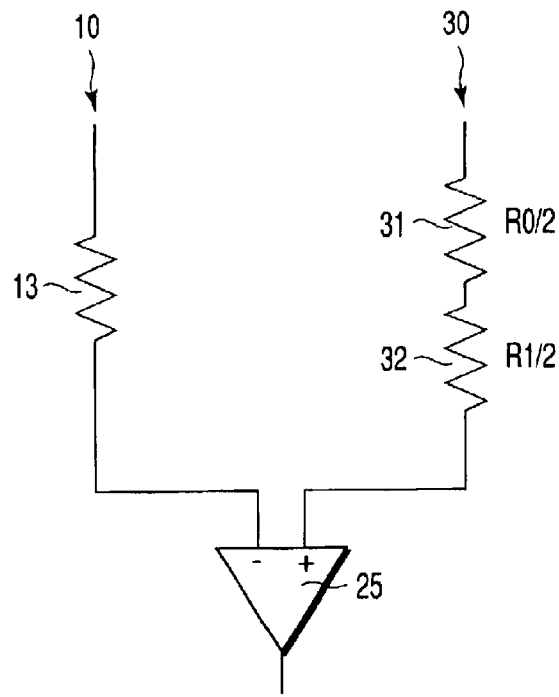
F I G. 13

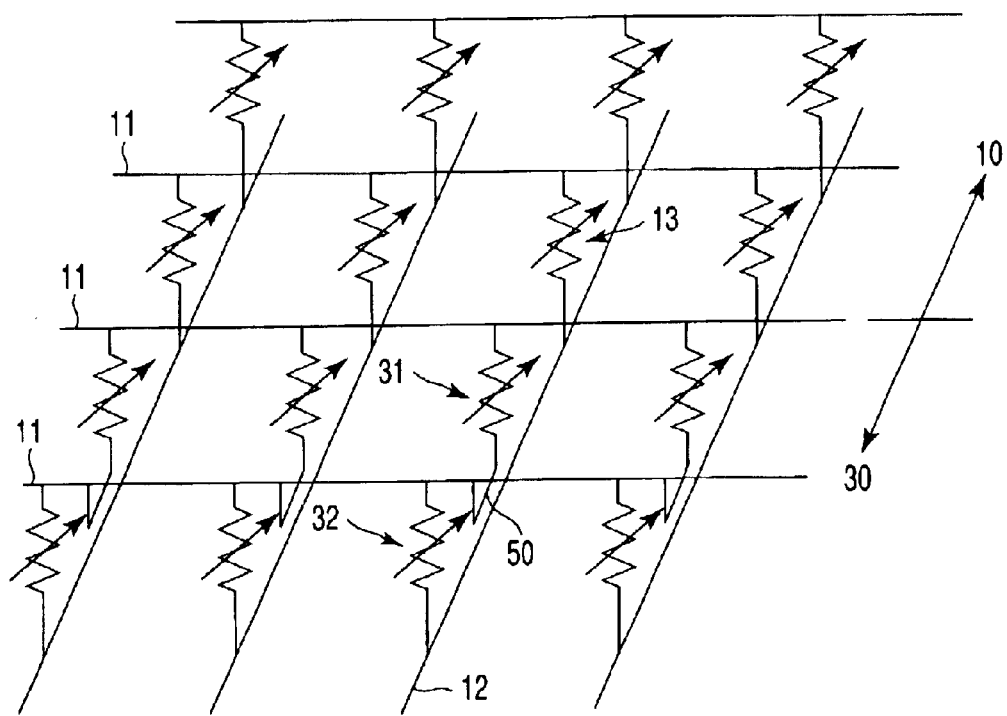
F I G. 18

US 6,778,426 B2

MAGNETIC RANDOM ACCESS MEMORY INCLUDING MEMORY CELL UNIT AND REFERENCE CELL UNIT

CROSS-REFERENCE TO RELATED APPLICATIONS

This application is based upon and claims the benefit of priority from the prior Japanese Patent Application No. 2001-241132, filed Aug. 8, 2001, the entire contents of which are incorporated herein by reference.

BACKGROUND OF THE INVENTION

1. Field of the Invention

The present invention relates to a semiconductor memory device and, more particularly, to a magnetic random access memory (MRAM) using a tunneling magneto resistance element (TMR) as a memory element.

2. Description of the Related Art

Recently, an MRAM (Magnetic Random Access Memory) cell using a magneto resistive effect is proposed as an information memory element. This MRAM has developed into a memory device having nonvolatile properties, high integration degree, high reliability, and high operating speed, and hence is increasingly expected in recent years as a device having potentials.

A GMR (Giant Magneto Resistive) element and a TMR (Tunneling Magneto Resistive) element are primarily known as this magneto resistance element. A GMR element has two ferromagnetic layers and a conductor sandwiched between these ferromagnetic layers. The resistance of this conductor changes in accordance with the magnetization directions in the upper and lower ferromagnetic layers. However, since the MR (Magneto Resistive) ratio of this GMR element is as low as 10%, a read margin is difficult to ensure. Therefore, GMR elements are limited to special purposes and have not been widely used yet. A TMR element has two ferromagnetic layers and an insulator sandwiched between these ferromagnetic layers. The tunnel resistance of this insulator changes in accordance with the magnetization directions in the upper and lower ferromagnetic layers. This TMR element can presently assure an MR ratio of about 50%. Hence, TMR elements have been studied as application devices more frequently than GMR elements.

Accordingly, an MRAM memory cell uses TMR elements as a memory element and a reference element. In data read, the resistance value of the memory cell is compared with that of the reference element to check whether the data is "1" or "0".

Unfortunately, the above prior art has the problem that variations in the resistance value of the reference element reduce the resistance difference between data "1" and "0". It is, therefore, necessary to suppress variations in the resistance value of the reference element.

BRIEF SUMMARY OF THE INVENTION

A magnetic memory device according to an aspect of the present invention comprises a first resistance element formed in a memory cell unit, and at least one second resistance element and at least one third resistance element formed in a reference cell unit, the first, second, and third resistance elements storing binary data by a resistance change, the second resistance element storing one of the binary data, and the third resistance element storing the other of the binary data.

BRIEF DESCRIPTION OF THE SEVERAL VIEWS OF THE DRAWING

FIG. 5 is a graph showing the relationship between the reference cell resistance variation and the MR ratio according to the first embodiment of the present invention;

FIG. 6A is another schematic circuit diagram showing the memory cell unit and reference cell unit according to the first embodiment of the present invention;

FIG. 12 is a circuit pattern diagram showing the magnetic random access memory according to the fourth embodiment of the present invention;

FIG. 13 is a schematic circuit diagram showing a memory cell unit and reference cell unit according to the fourth embodiment;

FIG. 18 is a circuit pattern diagram showing the magnetic random access memory device according to the sixth embodiment of the present invention.

DETAILED DESCRIPTION OF THE INVENTION

Figure 1:
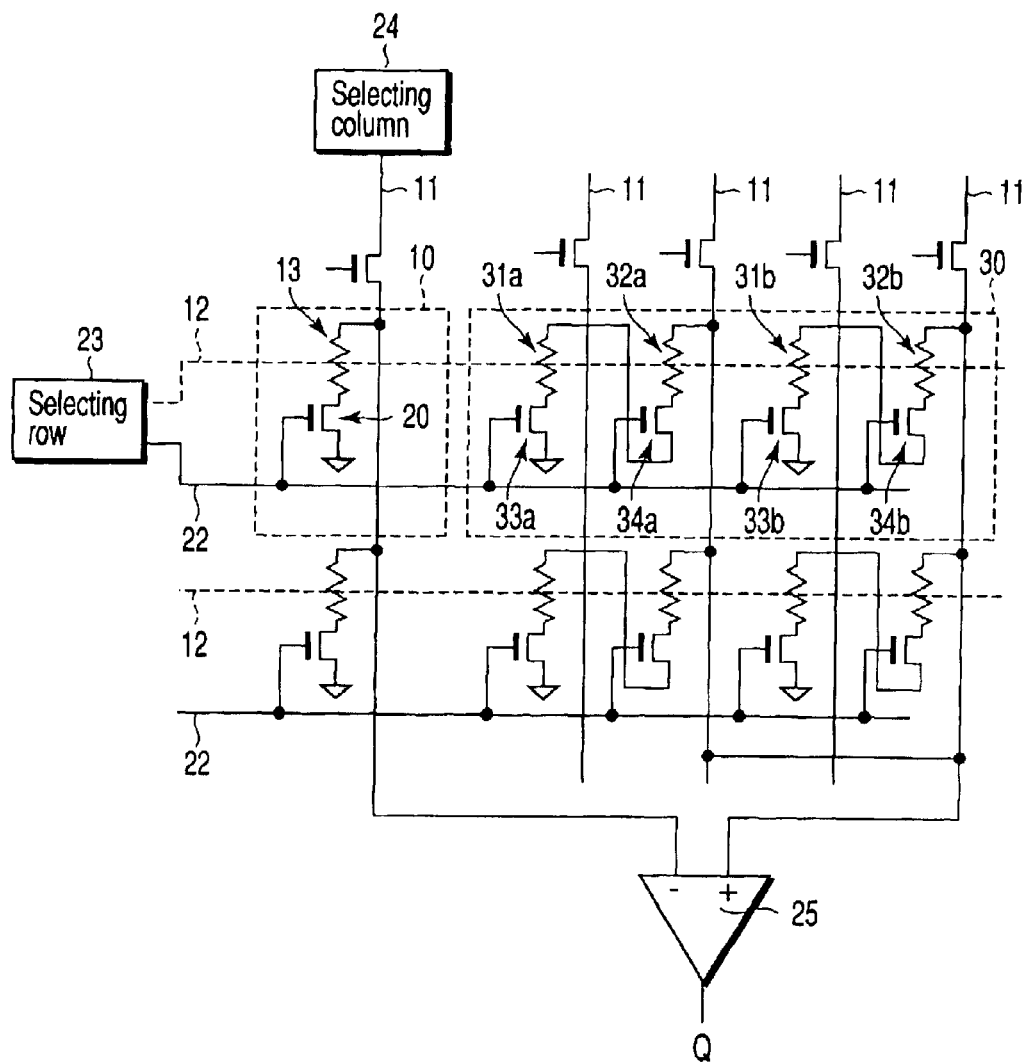
FIG. 1 is a circuit diagram showing a magnetic random access memory device according to the first embodiment of the present invention.

Embodiments of the present invention relate to a magnetic random access memory (MRAM) using, e.g., a tunneling magneto resistive (TMR) element as a memory element. This MRAM has a memory cell array structure in which a plurality of memory cells having TMR elements are arranged in a matrix manner. Decoders and sense circuits are formed around this memory cell array to access an arbitrary memory cell, thereby writing and reading information.

Embodiments of the present invention will be described below with reference to the accompanying drawing. In this explanation, the same reference numerals denote the same parts throughout the drawing.

[First Embodiment]

In this first embodiment, a one-bit memory cell unit is composed of one TMR element+one MOS transistor, and a reference cell unit is composed of (one TMR element+one MOS transistor)×4. Note that the reference cell unit is a cell which is selected simultaneously with a one-bit memory cell and compared with the memory cell in data read.

FIG. 1 is a circuit diagram showing a magnetic random access memory device according to the first embodiment of the present invention. As shown in FIG. 1, in this magnetic random access memory device according to the first embodiment, a one-bit memory cell unit 10 includes a TMR element 13 and a MOS transistor 20. A reference cell unit 30 for checking information written in the TMR element of this memory cell unit 10 includes four pairs of TMR elements and MOS transistors. That is, this reference cell unit 30 has a first pair of a first TMR element 31a for holding data "0" and a MOS transistor 33a, a second pair of a second TMR element 32a for holding data "1" and a MOS transistor 34a, a third pair of a third TMR element 31b for holding data "0" and a MOS transistor 33b, and a fourth pair of a fourth TMR element 32b for holding data "1" and a MOS transistor 34b.

In this reference cell unit 30, a TMR element for holding data "0" and a TMR element for holding data "1" make a pair. Therefore, TMR elements for holding data "0" and TMR elements for holding data "1" are desirably equal in number.

In this magnetic random access memory device, bit lines 11 and write word lines 12 are arranged in a matrix manner so as to cross each other at right angles. The TMR elements 13, 31a, 31b, 32a, and 32b are positioned near intersections of these bit lines 11 and write word lines 12. The memory cell unit 10 and the reference cell unit 30 which pairs with this memory cell unit 10 use the same write and read word lines 12 and 22. That is, the TMR elements 13, 31a, 31b, 32a, and 32b in the memory cell unit 10 and the reference cell unit 30 are arranged above the same write word line 12. Also, the MOS transistors 20, 33a, 33b, 34a, and 34b in the memory cell unit 10 and the reference cell unit 30 are electrically connected to the same read word line 22.

Figure 2:
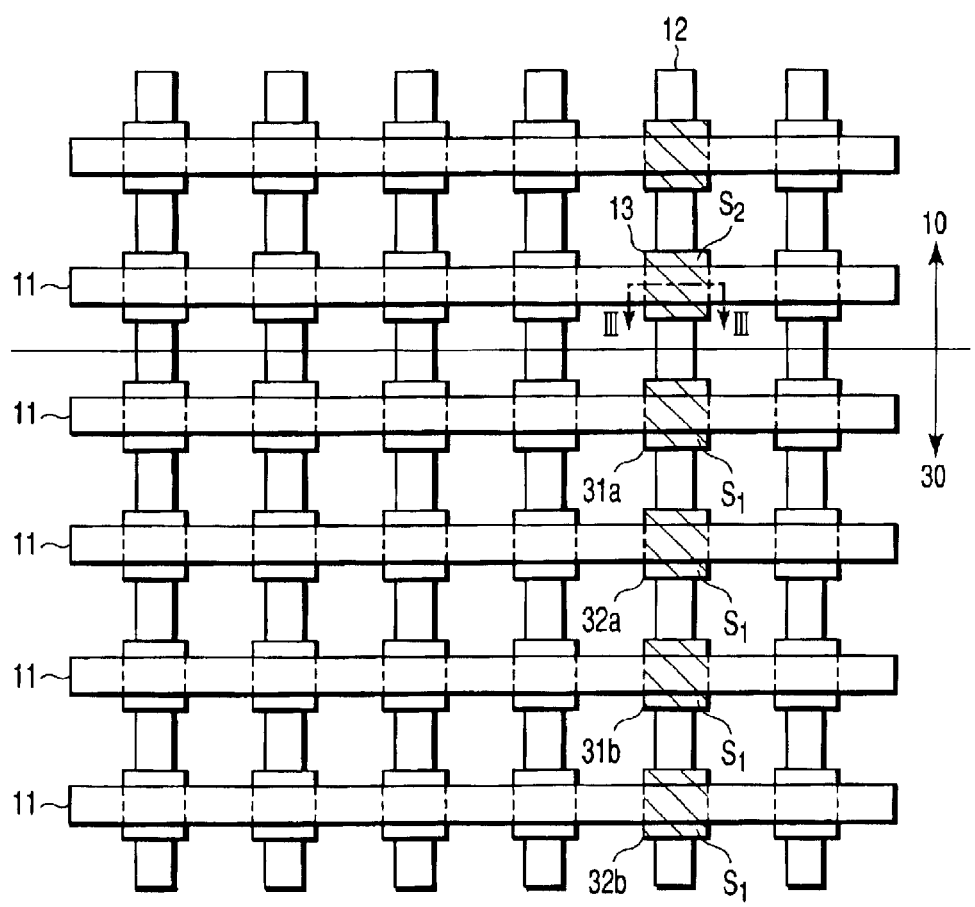
FIG. 2 is a schematic plan view showing the magnetic random access memory device according to the first embodiment of the present invention.
Figure 3:
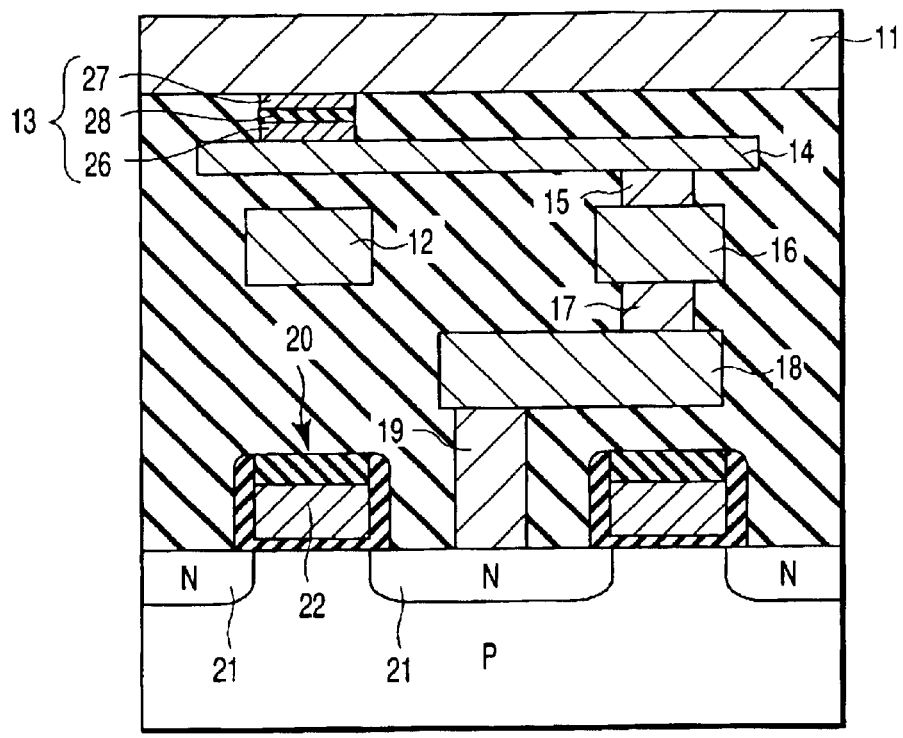
FIG. 3 is a sectional view showing the magnetic random access memory device in a memory cell unit taken along a line III—III in FIG. 2.

FIG. 2 is a schematic plan view of the magnetic random access memory device according to the first embodiment. FIG. 3 is a sectional view of the magnetic random access memory device in the memory cell unit taken along a line III—III in FIG. 2.

As shown in FIG. 2, an area $S_1$ of that portion of each of the TMR elements 31a, 31b, 32a, and 32b in the reference cell unit 30, which is in contact with the bit line 11 is the same as an area $S_2$ of that portion of the TMR element 13 in the memory cell unit 10, which is in contact with the bit line 11.

As shown in FIG. 3, in the memory cell unit 10 according to the first embodiment, one TMR element 13 is positioned in each intersection of the bit line 11 and the write word line 12. This TMR element 13 is connected to the bit line 11 via an upper electrode (not shown), and is connected to source/ drain diffusion layers 21 of the MOS transistor 20 via a lower electrode 14, first and second wiring layers 18 and 16, and first, second, and third contact layers 19, 17, and 15. The MOS transistor 20 is a read switching element for accessing the TMR element 13. The gate electrode of this MOS transistor 20 is the read word line 22.

The TMR element 13 is made up of a magnetic recording layer 26 which is a ferromagnetic layer connected to the lower electrode 14, a magnetically fixed layer 27 which is a ferromagnetic layer connected to the bit line 11 via the upper electrode, and a tunnel junction layer 28 which is a non-magnetic layer sandwiched between the magnetic recording layer 26 and the magnetically fixed layer 27.

The TMR element 13 is not restricted to the single tunnel junction structure described above, but can also have a double tunnel junction structure explained below. That is, a first tunnel junction layer is formed on a first magnetically fixed layer, and a magnetic recording layer is formed on this first tunnel junction layer. A second tunnel junction layer is formed on the magnetic recording layer, and a second magnetically fixed layer is formed on this second tunnel junction layer. A TMR element 13 having this double tunnel junction structure can operate at a higher bias than a TMR element 13 having the single tunnel junction structure, because deterioration of the MR (Magneto Resistive) ratio is little when the same external bias is applied.

A TMR element 13 having the single or double tunnel junction structure described above is formed using, e.g., the following materials.

Preferred examples of the materials of the magnetically fixed layer 27 and the magnetic recording layer 26 are Fe, Co, Ni, and their alloys, magnetite having large spin polarizability, oxides such as $CrO_2$ and $RXMnO_{3-y}$ (R; rare earth element, X; Ca, Ba, or Sr), and Heusler alloys such as NiMnSb and PtMnSb. These magnetic materials can also more or less contain nonmagnetic elements such as Ag, Cu, Au, Al, Mg, Si, Bi, Ta, B, C, O, N, Pd, Pt, Zr, Ir, W, Mo, and Nb, provided that ferromagnetism is not lost.

As the material of the tunnel junction layer 28, it is possible to use dielectric materials such as $Al_2O_3$, $SiO_2$, MgO, AlN, $Bi_2O_3$, $MgF_2$, $CaF_2$, $SrTiO_2$, and $AlLaO_3$. Oxygen, nitrogen, and fluorine deficiency may be present in these dielectric materials.

Figure 4:
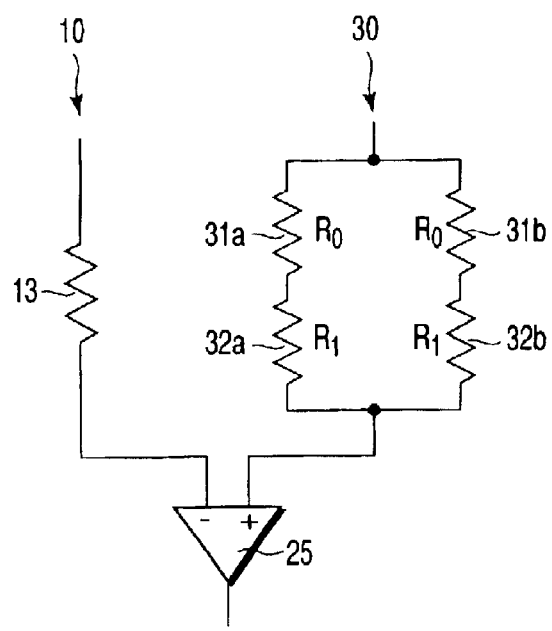
FIG. 4 is a schematic circuit diagram showing the memory cell unit and a reference cell unit according to the first embodiment of the present invention.

FIG. 4 is a schematic circuit diagram of the memory cell unit and reference cell unit according to the first embodiment. Note that the MOS transistors paired with the TMR elements are omitted from FIG. 4.

As shown in FIG. 4, in the reference cell unit 30 according to the first embodiment, the first TMR element 31a for holding data "0" and the second TMR element 32a for holding data "1" are connected in series via the MOS transistor (not shown). Similarly, the third TMR element 31b for holding data "0" and the fourth TMR element 32b for holding data "1" are connected in series via the MOS transistor (not shown). The series-connected first and second TMR elements 31a and 32a and the series-connected third and fourth TMR elements 31b and 32b are connected in parallel.

In the first and third TMR elements 31a and 31b for holding data "0", the magnetization directions in the magnetically fixed layer 27 and the magnetically recording layer 26 are anti-parallel to each other. In the second and fourth TMR elements 32a and 32b for holding data "1", the magnetization directions in the magnetically fixed layer 27 and the magnetically recording layer 26 are parallel to each other.

Let $R_r$ be the resistance value of the first, second, third, and fourth TMR elements 31a, 32a, 31b, and 32b as a whole, $R_0$ be the resistance value of the first and third TMR elements 31a and 31b for holding data "0", and $R_1$ be the resistance value of the second and fourth TMR elements 32a and 32b for holding data "1". Then, the resistance $R_r$ of this reference cell unit 30 as a whole is given by $$R_r = (R_0 + R_1)/2 \qquad (1)$$

In this way, the reference cell unit 30 produces the resistance $R_r$ which has an intermediate value between the resistance $R_0$ of the first and third TMR elements 31a and 31b for holding data "0", and the resistance $R_1$ of the second and fourth TMR elements 32a and 32b for holding data "1". This resistance $R_r$ is used as a reference value for discriminating between "1" and "0".

Information write and read operations when the MRAM cell according to the first embodiment is used will be briefly described below.

In the write operation, a write current flows through a bit line 11 and a write word line 12 selected by a selecting row 23 and a selecting column 24, generating current magnetic fields around these selected lines 11 and 12. Consequently, a synthetic magnetic field of these current magnetic fields of the two selected lines 11 and 12 is applied only to a TMR element 13 positioned near the intersection of these selected lines 11 and 12. The magnetization direction in the magnetically fixed layer 27 is normally fixed in one direction. The magnetic recording layer 26 has uniaxial anisotropy and is so formed that its magnetization points in the same direction as in the magnetically fixed layer 27. When the magnetization direction in this magnetic recording layer 26 is the same as that in the magnetically fixed layer 27, data "1" is written; when the magnetization direction in this magnetic recording layer 26 is opposite to that in the magnetically fixed layer 27, data "0" is written. To reverse this magnetization direction in the magnetic recording layer 26, a threshold value having a relationship indicated by expression (2) below is set. Consequently, data "1" or "0" can be written only in the selected one-bit TMR element 13.

(magnetic field generated by one write line)<(threshold value of cell writing magnetic field)<(synthetic magnetic field of two write lines) (2)

In the read operation, a bit line 11 and a read word line 22 corresponding to a selected memory cell unit 10 are selected. An electric current is allowed to flow through the selected bit line 11, the TMR element 13, the lower electrode 14, the third contact 15, the second wiring layer 16, the second contact 17, the first wiring layer 18, the first contact 19, and the MOS transistor 20. A comparison circuit 25 or the like outside this bit line 11 reads the resistance value of the TMR element 13 from this current value, thereby checking whether the data is "1" or "0". More specifically, on the basis of the resistance value $R_r$ of the reference cell unit 30, the comparison circuit 25 checks the value of current or voltage flowing through the TMR element 13 in the selected memory cell unit 10.

In the MRAM as described above, letting $\Delta R_m$ be the resistance variation in the memory cell unit 10 and $\Delta R_r$ be the resistance variation in the reference cell unit 30, the MR ratio of the TMR element 13 and these resistance variations $\Delta R_m$ and $\Delta R_r$ are required to satisfy $$MR \text{ ratio} > 2 \times (\Delta R_m + \Delta R_r) \qquad (3)$$

For example, if each of the resistance variations $\Delta R_m$ and $\Delta R_r$ is 21%, an MR ratio exceeding 84% is necessary.

However, the MR ratio of the present TMR element 13 is at most about 50%, so it is necessary to suppress these resistance variations $\Delta R_m$ and $\Delta R_r$. In the memory cell unit 10 in which the TMR element 13 must be micropatterned, the resistance variation $\Delta R_m$ is difficult to suppress. As in this first embodiment, therefore, the resistance variation $\Delta R_r$ in the reference cell unit 30 must be suppressed.

Under the circumstances, in the reference cell unit 30 according to the first embodiment, two different types of TMR elements, i.e., the first and third TMR elements 31a and 31b for holding data "0" and the second and fourth TMR elements 32a and 32b for holding data "1" are formed. Accordingly, even if variations are produced in the resistance values of these TMR elements 31a, 31b, 32a, and 32b, the resistance value of the reference cell unit 30 is the average resistance value of the TMR elements 31a, 31b, 32a, and 32b. This suppresses the resistance variation $\Delta R_r$ in the reference cell unit 30. Consequently, as shown in FIG. 5, it is possible to suppress the resistance variation $\Delta R_r$ in the reference cell unit 30 to, e.g., less than 8%, while the MR ratio is held at 45% or less.

Note that in the present invention, even if the resistance variation $\Delta R_r$ in the reference cell unit 30 is 8% or more, it is well possible to improve the read margin by, e.g., suppressing the resistance variation $\Delta R_m$ in the memory cell unit 10 or developing a material having high MR ratio.

In the first embodiment described above, the reference unit cell 30 has two different types of TMR elements, i.e., the first and third TMR elements 31a and 31b for holding data "0", and the second and fourth TMR elements 32a and 32b for holding data "1". That is, the resistance value $R_r$ of this reference cell unit 30 is the average of the resistance values of these TMR elements 31a, 31b, 32a, and 32b. Since, therefore, variations in the resistance value $R_r$ of the reference cell unit 30 as a whole can be suppressed, a large read margin can be ensured.

Also, the one-bit memory cell unit 10 is composed of one TMR element+one MOS transistor. Hence, the area occupied by this memory cell unit 10 can be made smaller than that of the conventional memory cell unit 10 having two TMR elements 13. This reduces the chip area.

Furthermore, the memory cell unit 10 and the reference cell unit 30 are formed by the same pattern arrangement by making the area $S_2$ of the TMR element 13 in the memory cell unit 10 equal to the area $S_1$ of each of the TMR elements 31a, 31b, 32a, and 32b in the reference cell unit 30. This achieves the four effects described below. First, the memory cell unit 10 and the reference cell unit 30 can be easily formed at the same time. Second, process induced variations in the resistance values and MR ratios of the TMR elements 13, 31a, 31b, 32a, and 32b can be suppressed. Third, the degree of freedom of the arrangement of the reference cell unit 30 is high, so the number of elements in this reference cell unit 30 can be easily changed only by changing wiring connections. This facilitates designing the memory cell unit 10 and the reference cell unit 30. Fourth, when the memory cell unit 10 is patterned by lithography, the reference cell unit 30 functions as a dummy cell which suppresses pattern density fluctuations. This prevents pattern defects.

Additionally, the TMR elements 31a, 31b, 32a, and 32b in the reference cell unit 30 are positioned in intersections of the bit lines 11 and the write word lines 12. This permits information to be written in each of these TMR elements 31a, 31b, 32a, and 32b in the reference cell unit 30. Therefore, rewrite can be performed for this reference cell unit 30 so that the state of the reference cell unit 30 is optimum with respect to the recorded state of the memory cell unit 10. This can further increase the read margin.

The number of pairs of TMR elements for holding data "0" and TMR elements for holding data "1" in the reference cell unit 30 can be increased, provided that the relationship of equation (1) is met. For example, as shown in FIG. 6A, eight TMR elements 31 for holding data "0" and eight TMR elements 32 for holding data "1" can be formed. By thus combining a plurality of pairs of the TMR elements 31 for holding data "0" and the TMR elements 32 for holding data "1", the whole reference cell unit 30 becomes less susceptible to the influence of variations in the resistance values and MR ratios of the individual TMR elements 31 and 32. This can further increase the read margin.

Figure 6B:
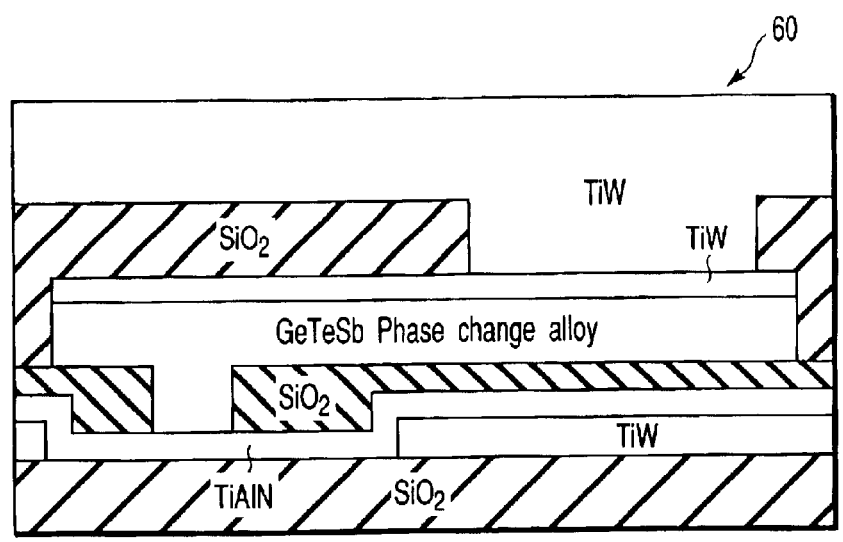
FIG. 6B is a sectional view showing a phase change element used instead of a TMR element according to the first embodiment of the present invention.

Also, as shown in FIG. 6B, a phase change memory element 60 can be used instead of the TMR element. A phase change memory using this phase change memory element 60 as a memory element stores data "1" or "0" by using a phenomenon in which the specific resistance of a Ge—Sb—Te-based phase change film in an amorphous state differs from that in a crystal state. Data "1" or "0" is rewritten by heating this phase change film by supplying a pulse current to a resistance element connected in series with the phase change film. Even when the phase change memory element 60 is used as described above, effects similar to the above-mentioned first embodiment can be obtained. In addition, when this phase change memory element 60 is used, a resistance change (>100%) much larger than when an MR element is used can be obtained. This realizes a stable operation as a memory.

[Second Embodiment]

In the second embodiment, a one-bit memory cell unit is composed of one TMR element+one diode, and a reference cell unit is composed of (one TMR element+one diode)×4. In this second embodiment, the same structures as in the first embodiment described above will be omitted, and only different structures will be explained.

Figure 7:
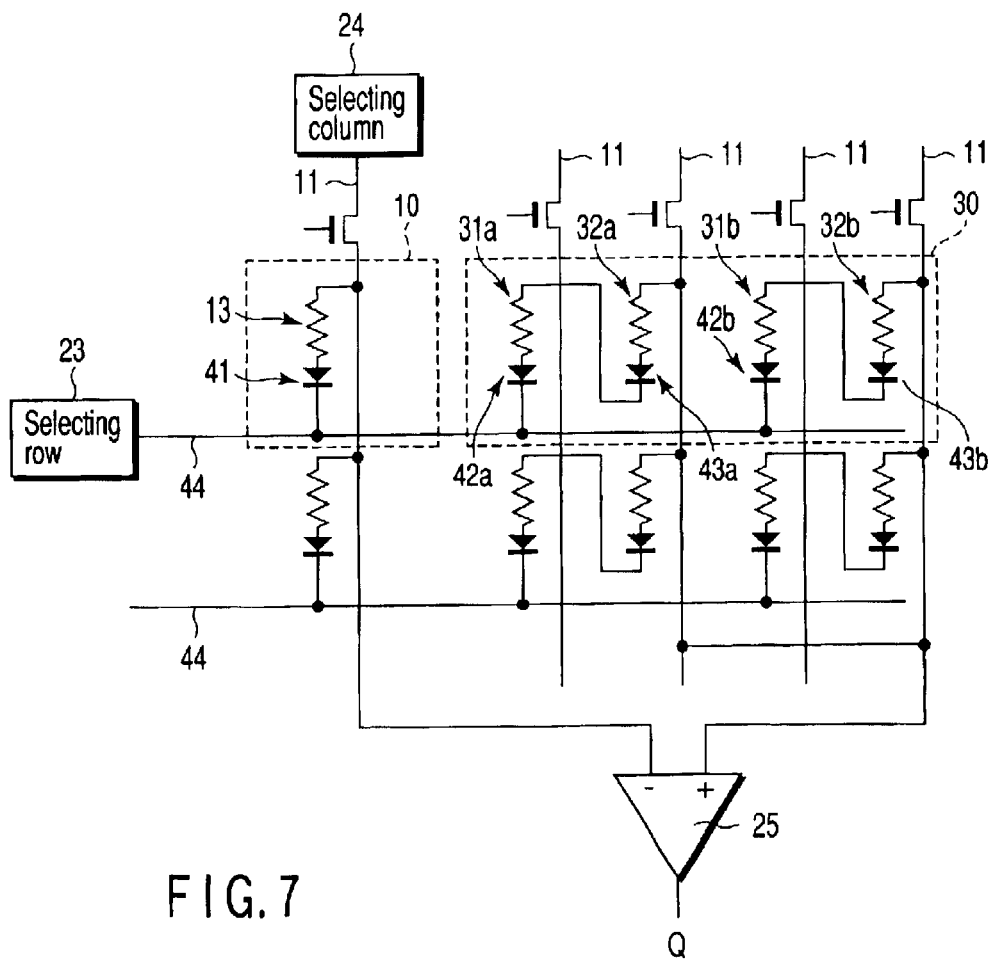
FIG. 7 is a circuit diagram showing a magnetic random access memory device according to the second embodiment of the present invention.

FIG. 7 is a circuit diagram showing a magnetic random access memory device according to the second embodiment of the present invention. As shown in FIG. 7, in this magnetic random access memory device according to the second embodiment, a one-bit memory cell unit 10 includes a TMR element 13 and a diode 41. A reference cell unit 30 for checking information written in the TMR element 13 of this memory cell unit 10 includes four pairs of TMR elements and diodes. That is, this reference cell unit 30 has a first pair of a first TMR element 31a for holding data "0" and a diode 42a, a second pair of a second TMR element 32a for holding data "1" and a diode 43a, a third pair of a third TMR element 31b for holding data "0" and a diode 42b, and a fourth pair of a fourth TMR element 32b for holding data "1" and a diode 43b. The diodes 41, 42a, 42b, 43a, and 43b can be any rectifying elements such as p-n junction diodes or Schottky diodes.

In this magnetic random access memory device, bit lines 11 and word lines 44 are arranged in a matrix manner so as to cross each other at right angles. The TMR elements 13, 31a, 31b, 32a, and 32b are positioned near intersections of these bit lines 11 and word lines 44. The memory cell unit 10 and the reference cell unit 30 which pairs with this memory cell unit 10 use the same word line 44. That is, the diode 41 in the memory cell unit 10 and the diodes 42a and 42b which make pairs with the TMR elements 31a and 31b for holding data "0" in the reference cell unit 30 are connected to the same word line 44.

Figure 8:
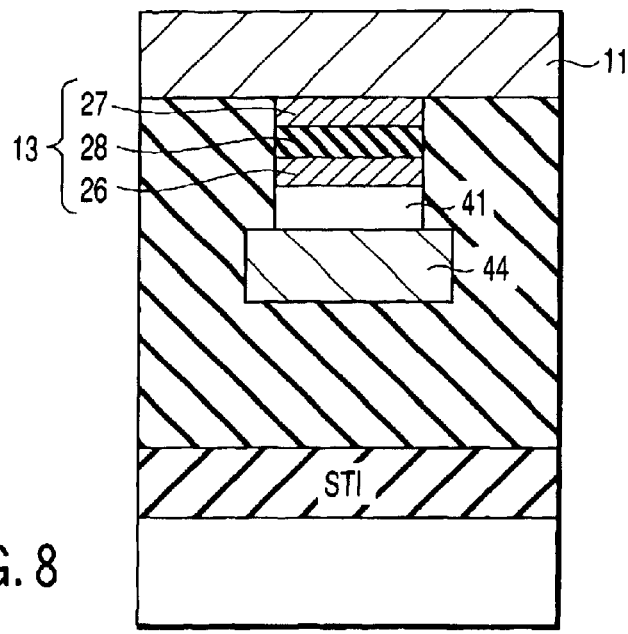
FIG. 8 is a sectional view showing the magnetic random access memory device in a memory cell unit according to the second embodiment of the present invention.

FIG. 8 is a sectional view showing the magnetic random access memory device in the memory cell unit according to the second embodiment. As shown in FIG. 8, in this memory cell unit 10 according to the second embodiment, the TMR element 13 and the diode 41 as a switching element are formed between the bit line 11 and the word line 44. That is, a magnetically fixed layer 27 and a magnetic recording layer 26 of this TMR element 13 are connected to the bit line 11 and the diode 41, respectively. The diode 41 is connected to the word line 44.

In this structure, a write line for writing information in the magnetic recording layer 26 and a read line for reading out information from it are the same. So, information write and read operations are performed only by two lines, i.e., the word line 44 and the bit line 11. To write and read information only with respect to a selected cell by using rectification properties of the diode 41, it is necessary to control biases applied to the word line 44 and the bit line 11.

In the second embodiment, similar to the first embodiment, a resistance $R_r$, which satisfies the relationship of equation (1), of the reference cell unit 30 can be produced by combining a plurality of pairs of the TMR elements 31a and 31b for holding data "0" and the TMR elements 32a and 32b for holding data "1". Also, as in the first embodiment, an area $S_1$ of that portion of each of the TMR elements 31a, 31b, 32a, and 32b in the reference cell unit 30, which is in contact with the bit line 11 is the same as an area $S_2$ of that portion of the TMR element 13 in the memory cell unit 10, which is in contact with the bit line 11.

The second embodiment described above can achieve the same effects as in the first embodiment.

Furthermore, the cell area per bit can be made smaller than in the first embodiment, since the diode 41 is used as a switching element.

[Third Embodiment]

The third embodiment is an example of a structure which uses no diode in the second embodiment. In this third embodiment, the same structures as in the first and second embodiments described above will be omitted, and only different structures will be explained.

Figure 9:
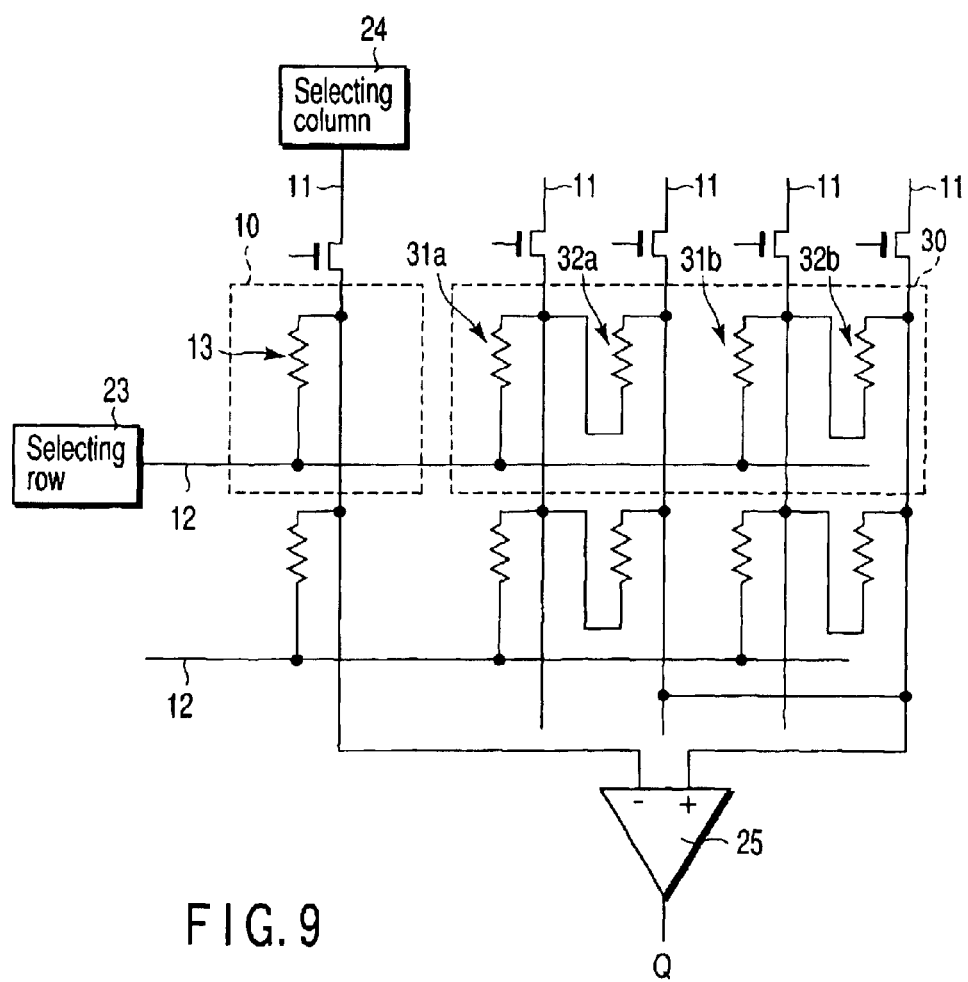
FIG. 9 is a circuit diagram showing a magnetic random access memory device according to the third embodiment of the present invention.

FIG. 9 is a circuit diagram showing a magnetic random access memory device according to the second embodiment of the present invention. As shown in FIG. 9, in this magnetic random access memory device according to the third embodiment, a one-bit memory cell unit 10 includes only a TMR element 13. A reference cell unit 30 for checking information written in the TMR element 13 of this memory cell unit 10 includes four TMR elements. That is, this reference cell unit 30 has a first TMR element 31a for holding data "0", a second TMR element 32a for holding data "1", a third TMR element 31b for holding data "0", and a fourth TMR element 32b for holding data "1".

In this magnetic random access memory device, bit lines 11 and write word lines 12 are arranged in a matrix manner so as to cross each other at right angles. The TMR elements 13, 31a, 31b, 32a, and 32b are positioned near intersections of these bit lines 11 and write word lines 12. The memory cell unit 10 and the reference cell unit 30 which pairs with this memory cell unit 10 use the same write word line 12. That is, the TMR element 13 in the memory cell unit 10 and the TMR elements 31a and 31b for holding data "0" in the reference cell unit 30 are connected to the same write word line 12.

Figure 10:
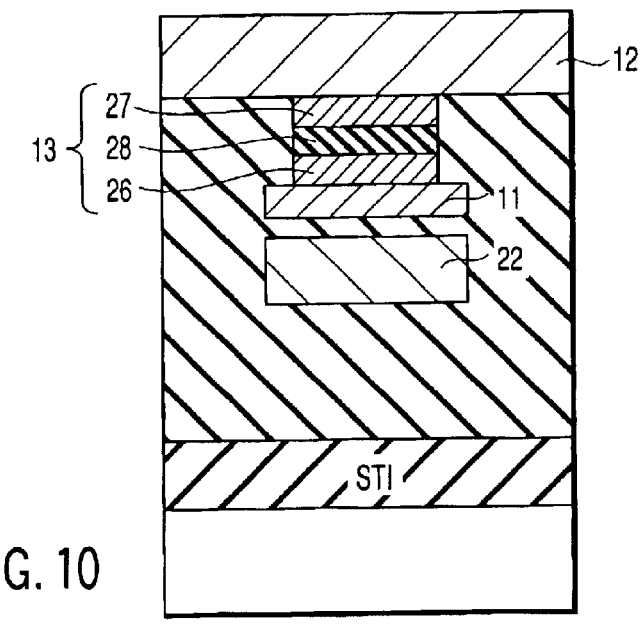
FIG. 10 is a sectional view showing the magnetic random access memory device in a memory cell unit according to the third embodiment of the present invention.

FIG. 10 is a sectional view showing the magnetic random access memory device in the memory cell unit according to the second embodiment. As shown in FIG. 10, in this memory cell unit 10 according to the third embodiment, the TMR element 13 is formed between the bit line 11 and the write word line 12. That is, a magnetically fixed layer 27 and a magnetic recording layer 26 of this TMR element 13 are connected to the write word line 12 and the bit line 11, respectively. A read word line 22 is formed away from the bit line 11.

In this structure, information is written in a selected cell by using the read word line 22 and the write word line 12, and information is read out from a selected cell by using the bit line 11 and the read word line 22. In this way, only one of the read and write lines is used as a common line, and a cell is accessed by using a total of three lines.

In the third embodiment, similar to the first embodiment, a resistance $R_r$, which is given by equation (1), of the reference cell unit 30 can be produced by combining a plurality of pairs of the TMR elements 31a and 31b for holding data "0" and the TMR elements 32a and 32b for holding data "1". Also, as in the first embodiment, an area $S_1$ of that portion of each of the TMR elements 31a, 31b, 32a, and 32b in the reference cell unit 30, which is in contact with the bit line 11 is the same as an area $S_2$ of that portion of the TMR element 13 in the memory cell unit 10, which is in contact with the bit line 11.

The third embodiment described above can achieve the same effects as in the first embodiment.

Furthermore, since no switching element is used, the cell area per bit can be made smaller than when a switching element is used.

[Fourth Embodiment]

In the fourth embodiment, a one-bit memory cell unit is composed of one TMR element+one MOS transistor, and a reference cell unit is composed of (one TMR element+one MOS transistor)×2. In this fourth embodiment, the same structures as in the first embodiment described above will be omitted, and only different structures will be explained.

Figure 11:
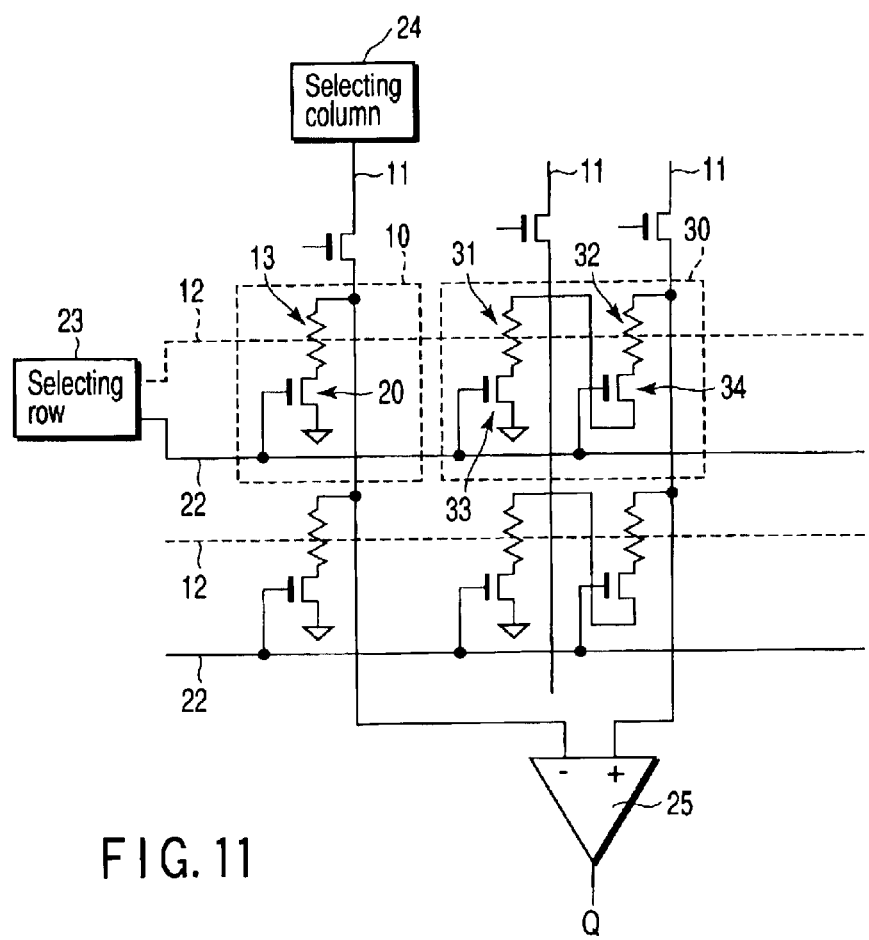
FIG. 11 is a circuit diagram showing a magnetic random access memory device according to the fourth embodiment of the present invention.

FIG. 11 is a circuit diagram showing a magnetic random access memory device according to the fourth embodiment of the present invention. As shown in FIG. 11, in this magnetic random access memory device according to the fourth embodiment, a one-bit memory cell unit 10 includes a TMR element 13 and a MOS transistor 20. A reference cell unit 30 for checking information written in the TMR element 13 of this memory cell unit 10 includes two pairs of TMR elements and MOS transistors. That is, this reference cell unit 30 has a first pair of a first TMR element 31 for holding data "0" and a MOS transistor 33, and a second pair of a second TMR element 32 for holding data "1" and a MOS transistor 34.

FIG. 12 is a circuit pattern diagram of the magnetic random access memory device according to the fourth embodiment of the present invention. As shown in FIG. 12, in the reference cell unit 30, the MOS transistor 33 and the second TMR element 32 are connected by a line 50. Accordingly, the TMR elements 13, 31, and 32 and the MOS transistors 20, 33, and 34 in the memory cell unit 10 and the reference cell unit 30 can be formed by the same pattern.

FIG. 13 is a schematic circuit diagram of the memory cell unit and reference cell unit according to the fourth embodiment. As shown in FIG. 13, in the reference cell unit 30 according to the fourth embodiment, the first TMR element 31 for holding data "0" and the second TMR element 32 for holding data "1" are connected in series via a MOS transistor (not shown). Referring to FIG. 13, the MOS transistors 33 and 34 paired with these TMR elements 31 and 32 are omitted.

In this fourth embodiment constructed as above, the number of TMR elements in the reference cell unit 30 is ½ that in the first embodiment. To produce the reference cell unit 30 meeting the relationship of equation (1) as in the first embodiment, therefore, the resistance of each TMR element in the reference cell unit 30 according to the fourth embodiment must be ½ that of each TMR element in the reference cell unit 30 according to the first embodiment.

Accordingly, let $R_r$ be the resistance value of the first and second TMR elements 31 and 32 as a whole, $R_0/2$ be the resistance value of the first TMR element 31 for holding data "0", and $R_1/2$ be the resistance value of the second TMR element 32 for holding data "1". Then, the resistance $R_r$ of this reference cell unit 30 according to the fourth embodiment is given by $$R_r = R_0/2 + R_1/2 = (R_0 + R_1)/2 \qquad (4)$$

In this way, the reference cell unit 30 produces the resistance $R_r$ which has an intermediate value between the resistance $R_0$ of the first TMR element 31 for holding data "0" and the resistance $R_1$ of the second TMR element 32 for holding data "1". This resistance $R_r$ is used as a reference value for discriminating between "1" and "0".

Figure 14:
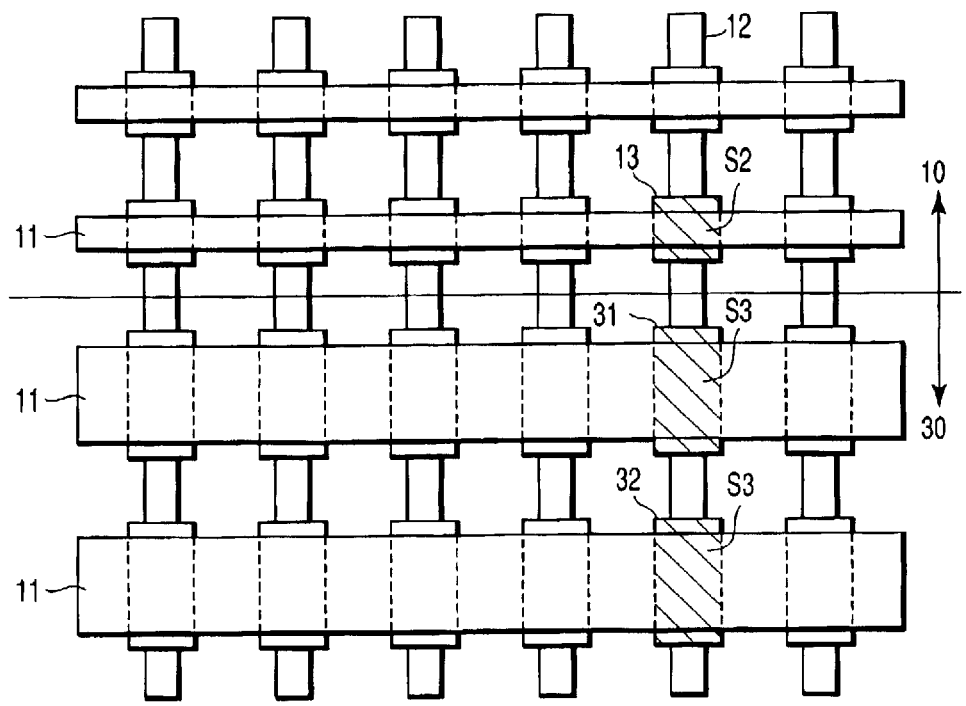
FIG. 14 is a schematic plan view showing the magnetic random access memory device according to the fourth embodiment of the present invention.

FIG. 14 is a schematic plan view of the magnetic random access memory device according to the fourth embodiment. As described above, the resistance of each TMR element in the reference cell unit 30 according to the fourth embodiment must be ½ that of each TMR element in the reference cell unit 30 according to the first embodiment. As shown in FIG. 14, therefore, an area $S_3$ of that portion of each of the TMR elements 31 and 32 in the reference cell unit 30, which is in contact with a bit line 11 is made twice the area $S_1$ of the TMR element shown in FIG. 2. In other words, the area $S_3$ of the TMR element is made twice the area $S_2$ of that portion of the TMR element 13 in the memory cell unit 10, which is in contact with the bit line 11.

To reliably write and read data, the width of the bit line 11 in the reference cell unit 30 is preferably increased as the area $S_3$ of the TMR element is increased. That is, the width of the bit line 11 in the reference cell unit 30 according to the fourth embodiment is preferably made larger than that in the first embodiment in which a plurality of TMR elements for holding data "0" and a plurality of TMR elements for holding data "1" are formed in the reference cell unit 30. Also, in this fourth embodiment, the width of the bit line 11 in the reference cell unit 11 is favorably made larger than that of the bit line 11 in the memory cell unit 10.

The fourth embodiment described above can achieve the same effects as in the first embodiment.

Furthermore, the numbers of TMR elements and MOS transistors in the reference cell unit 30 can be reduced. This reduces the area occupied by the reference cell unit 30 in the chip area.

[Fifth Embodiment]

In the fourth embodiment, a one-bit memory cell unit is composed of one TMR element+one diode, and a reference cell unit is composed of (one TMR element+one diode)×2. In this fifth embodiment, the same structures as in the fourth embodiment described above will be omitted, and only different structures will be explained.

Figure 15:
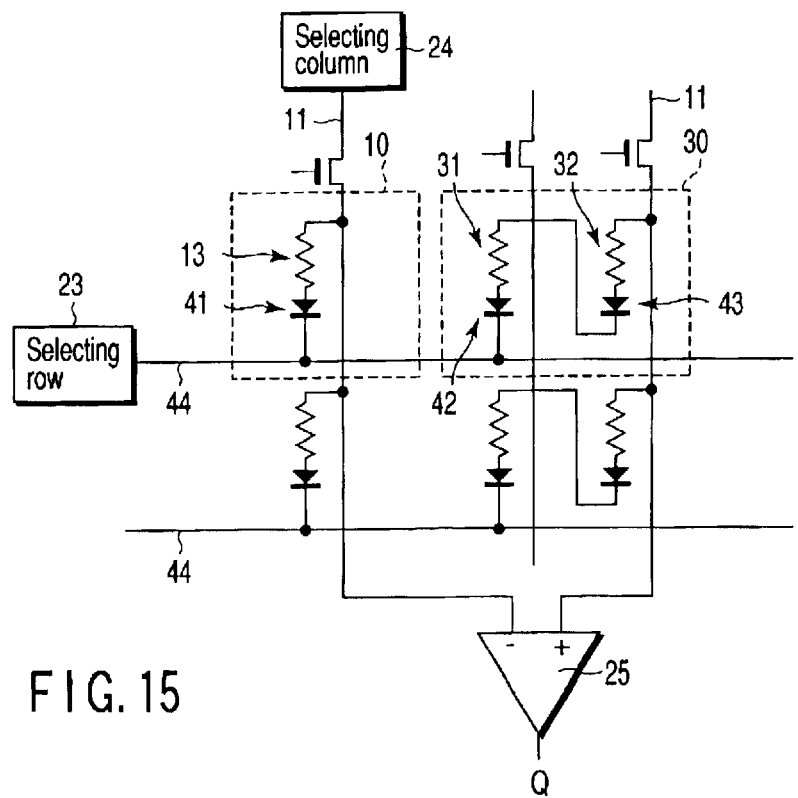
FIG. 15 is a circuit diagram showing a magnetic random access memory device according to the fifth embodiment of the present invention.

FIG. 15 is a circuit diagram showing a magnetic random access memory device according to the fourth embodiment of the present invention. As shown in FIG. 15, in this magnetic random access memory device according to the fifth embodiment, a one-bit memory cell unit 10 includes a TMR element 13 and a diode 41. A reference cell unit 30 for checking information written in the TMR element 13 of this memory cell unit 10 includes two pairs of TMR elements and diodes. That is, this reference cell unit 30 has a first pair of a first TMR element 31 for holding data "0" and a diode 42, and a second pair of a second TMR element 32 for holding data "1" and a diode 43.

Figure 16:
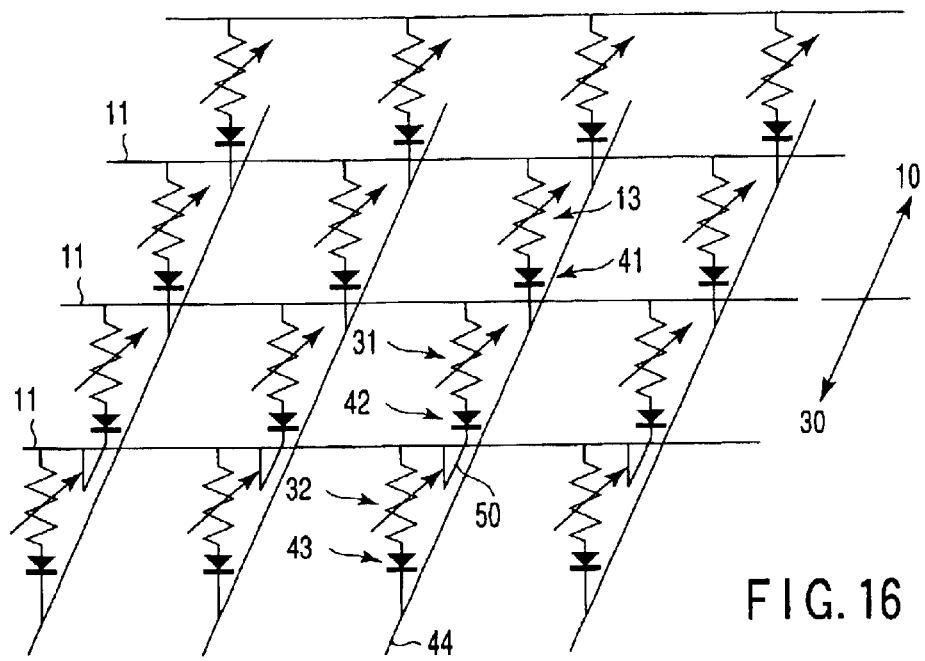
FIG. 16 is a circuit pattern diagram showing the magnetic random access memory device according to the fifth embodiment of the present invention.

FIG. 16 is a circuit pattern diagram of the magnetic random access memory device according to the fifth embodiment of the present invention. As shown in FIG. 16, in the reference cell unit 30, the diode 42 and the second TMR element 32 are connected by a line 50. Accordingly, the TMR elements 13, 31, and 32 and the diodes 41, 42, and 43 in the memory cell unit 10 and the reference cell unit 30 can be formed by the same pattern.

In this fifth embodiment, similar to the fourth embodiment, an area $S_3$ of that portion of each of the TMR elements 31 and 32 in the reference cell unit 30, which is in contact with a bit line 11 is made twice an area $S_2$ of that portion of the TMR element 13 in the memory cell unit 10, which is in contact with the bit line 11, thereby lowering the resistances of these TMR elements 31 and 32. In this manner, the TMR element 31 for holding data "0" and the TMR element 32 for holding data "1" can produce a resistance $R_r$, which is given by equation (4), of the reference cell unit 30.

The fifth embodiment described above can achieve the same effects as in the fourth embodiment.

Furthermore, since the diode 41 is used as a switching element, the cell area per bit can be made smaller than in the fourth embodiment.

[Sixth Embodiment]

The sixth embodiment is an example of a structure which uses no diode in the fifth embodiment. In this sixth embodiment, the same structures as in the fifth embodiment described above will be omitted, and only different structures will be explained.

Figure 17:
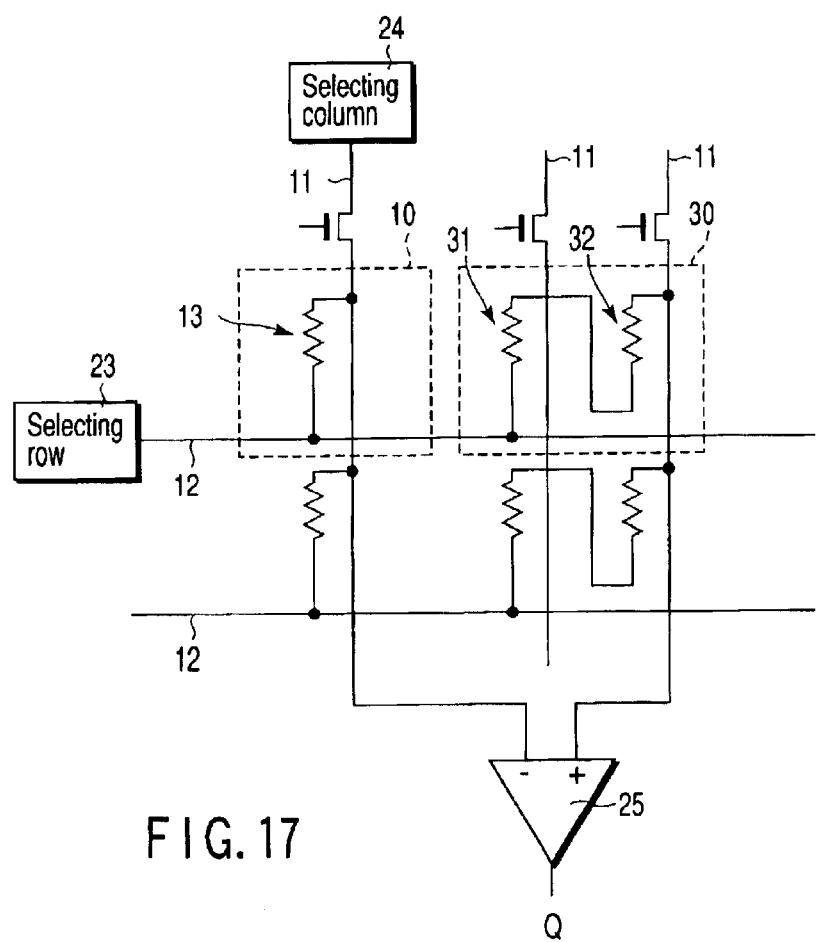
FIG. 17 is a circuit diagram showing a magnetic random access memory device according to the sixth embodiment of the present invention.

FIG. 17 is a circuit diagram showing a magnetic random access memory device according to the sixth embodiment of the present invention. As shown in FIG. 17, in this magnetic random access memory device according to the sixth embodiment, a one-bit memory cell unit 10 includes only a TMR element 13. A reference cell unit 30 for checking information written in the TMR element 13 of this memory cell unit 10 includes two TMR elements. That is, this reference cell unit 30 has a first TMR element 31 for holding data "0", and a second TMR element 32 for holding data "1".

FIG. 18 is a circuit pattern diagram of the magnetic random access memory device according to the sixth embodiment of the present invention. As shown in FIG. 18, in the reference cell unit 30, the first and second TMR elements 31 and 32 are connected by a line 50. Accordingly, the TMR elements 13, 31, and 32 can be formed by the same pattern.

In this sixth embodiment, similar to the fourth embodiment, an area $S_3$ of that portion of each of the TMR elements 31 and 32 in the reference cell unit 30, which is in contact with a bit line 11 is made twice an area $S_2$ of that portion the TMR element 13 in the memory cell unit 10, which is in contact with the bit line 11, thereby lowering the resistances of these TMR elements 31 and 32. In this manner, the TMR element 31 for holding data "0" and the TMR element 32 for holding data "1" can produce a resistance $R_r$, which is given by equation (4), of the reference cell unit 30.

The sixth embodiment described above can achieve the same effects as in the fourth embodiment.

Furthermore, since no switching element is used, the cell area per bit can be made smaller than when a switching element is used.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A magnetic memory device comprising:

a first resistance element formed in a memory cell unit; and at least one second resistance element and at least one third resistance element formed in a reference cell unit, said first, second, and third resistance elements storing one of the binary data, and said third resistance element storing the other of the binary data, each of said first, second, and third resistance elements includes at least three layers, said three layers comprising first and second magnetic layers and a nonmagnetic layer, said first and second magnetic layers of said second resistance element having anti-parallel magnetization directions, and magnetization directions in said first and second magnetic layers of said third resistance element are parallel.

2. A memory device according to claim 1, wherein letting $R_0$ be the resistance value of said second resistance element and $R_1$ be the resistance value of said third resistance element, the resistance value of said first and second resistance elements as a whole is $(R_0+R_1)/2$.

3. A memory device according to claim 1, further comprising:

a first transistor or first rectifying element connected to said first resistance element to make a pair;

a second transistor or second rectifying element connected to said second resistance element to make a pair; and a third transistor or third rectifying element connected to said third resistance element to make a pair.

4. A memory device according to claim 1, wherein said second and third resistance elements are connected in series.

5. A memory device according to claim 1, wherein said first, second, and third resistance elements have a same area.

6. A memory device according to claim 1, wherein when one second resistance element and one third resistance element are formed in said reference cell unit, an area of each of said second and third resistance elements is twice an area of said first resistance element.

7. A memory device according to claim 1, further comprising:

first wirings extending in a first direction; and second wirings extending in a second direction different from the first direction, said first, second, and third resistance elements being formed in intersections of said first and second wirings.

8. A memory device according to claim 7, wherein when one second resistance element and one third resistance element are formed in said reference cell unit, an area of each of said second and third resistance elements is twice an area of said first resistance element, and said first or second wirings in said reference cell unit is wider than said first or second wirings in said memory cell unit.

9. A memory device according to claim 7, wherein said first, second, and third resistance elements are arranged above the same one of said first or second wirings.

10. A memory device according to claim 7, further comprising:

a first transistor or first rectifying element connected to said first resistance element to make a pair;

a second transistor or second rectifying element connected to said second resistance element to make a pair; and a third transistor or third rectifying element connected to said third resistance element to make a pair, said first, second, and third transistors or first, second, and third rectifying elements connected to the same one of said first or second wirings.

11. A memory device according to claim 1, wherein said first, second, and third resistance elements are formed by the same pattern.

12. A memory device according to claim 1, wherein said second and third resistance elements are equal in number.

13. A magnetic memory device according to claim 1, wherein said first, second, and third resistance elements are magneto resistive elements.

14. A magnetic device according to claim 1, wherein said first resistance element makes a pair with a reference element having said second and third resistance elements.

15. A magnetic memory device according to claim 1, wherein said first, second, and third resistance elements are electrically connected to a same read word line.

16. A magnetic memory device according to claim 1, further comprising:
- a first bit line electrically connected to said second resistance element; and
- a second bit line being different from said first bit line and electrically connected to said third resistance element.

* * * * *